United States Patent [19]

Stones et al.

[11] Patent Number: 5,912,598
[45] Date of Patent: Jun. 15, 1999

[54] WAVEGUIDE-TO-MICROSTRIP TRANSITION FOR MMWAVE AND MMIC APPLICATIONS

[75] Inventors: David I. Stones, Torrance; H. Alfred Hung, Arcadia, both of Calif.

[73] Assignee: TRW Inc., Redondo Beach, Calif.

[21] Appl. No.: 08/886,311

[22] Filed: Jul. 1, 1997

[51] Int. Cl.⁶ ................................................ H01P 5/107
[52] U.S. Cl. .................................... 333/26; 333/33
[58] Field of Search .................... 333/21 R, 26, 333/33

[56] References Cited

U.S. PATENT DOCUMENTS

| | | | |
|---|---|---|---|
| 4,453,142 | 6/1984 | Murphy | 333/26 |
| 4,550,296 | 10/1985 | Ehrlinger et al. | 333/26 |
| 4,851,794 | 7/1989 | Williams et al. | 333/33 |
| 5,198,786 | 3/1993 | Russell et al. | 333/26 |
| 5,202,648 | 4/1993 | McCandless | 333/26 |
| 5,235,300 | 8/1993 | Chan et al. | 333/247 |
| 5,319,329 | 6/1994 | Shiau et al. | 333/204 |
| 5,396,202 | 3/1995 | Scheck | 333/26 X |
| 5,414,394 | 5/1995 | Gamand et al. | 333/26 |
| 5,539,361 | 7/1996 | Davidovitz | 333/26 |
| 5,559,480 | 9/1996 | Ivanivsky | 333/21 R |
| 5,600,286 | 2/1997 | Livingston et al. | 333/26 |
| 5,726,664 | 3/1998 | Park et al. | 333/26 X |

FOREIGN PATENT DOCUMENTS 5-335815  12/1993  Japan ........................................ 333/26

OTHER PUBLICATIONS

S.S. Moochalla, C. An, "Ridge Waveguide Used in Microstrip Transition", Microwaves and RF, Mar. 1984.
W. Menzel and A. Klaassen, "On the Transition from Ridged Waveguide to Microstrip", Proc. 19th European Microwave Conf., pp. 1265–1269, 1989.
L.J. Lavedan, "Design of Waveguide–to–Microstrip Transitions Specially Suited to Millimetre–Wave Applications", Electronic Letters, vol. 13, No. 20, pp. 604–605, Sep. 1977.
T.Q. Ho and Y. Shih, "Spectral–Domain Analysis of E–Plane Waveguide to Microstrip Transitions", IEEE Trans. Microwave Theory and Tech., vol. 37, pp. 388–392, Feb. 1989.
D.I. Stones, "Analysis of a Novel Microstrip–to–Waveguide Transition/Combiner", IEEE MTT–S Int'l Symposium Digest, San Diego, Ca, vol. 1, pp. 217–220, 1994.
B.N. Das, K.V.S.V.R. Prasad, and S. Rao, "Excitation of Waveguide by Stripline–and Microstrip–Line–Fed Slots", IEEE Trans. Microwave Theory and Tech., vol. 34, pp. 321–327, Mar. 1986.
R.E. Collin, "Field Theory of Guided Waves", McGraw–Hill, New York, ch. 8, 1960, pp. 547–603.
L. Hyvonen and A. Hujanen, "A Compact MMIC–Compatible Microstrip to Waveguide Transition", IEEE MMT–S Int'l Symposium Digest, San Francisco, Ca, vol. 2, pp. 875–878, 1996.

*Primary Examiner*—Seungsook Ham
*Attorney, Agent, or Firm*—Michael S. Yatsko

[57] ABSTRACT

A waveguide-to-microstrip transition package (30) for processing electromagnetic wave signals includes a waveguide (32) for directing the signals to the input of the waveguide (32). A substrate (34) overlaps the input of the waveguide (32) to form a hermetic seal. A metallized probe (36) conducts the signals to a microstrip line (40) and is patterned upon the substrate (34). The transition (30) also includes an iris (48) formed from a metallized pattern on the opposite side of the substrate (34) from the probe (36). The special design of the probe (36), the structure of the iris (48) and the wave guide cavity (46) above the probe (36) allow impedance matching and efficient signal transfer from waveguide (32) to microstrip line (40) or from microstrip line (40) to waveguide (32).

18 Claims, 9 Drawing Sheets

WAVEGUIDE-TO-MICROSTRIP TRANSITION FOR MMWAVE AND MMIC APPLICATIONS

This invention was made with government support under grant DAAL01-95-C-3536 awarded from the DARPA/MAFET program. The government has certain rights in the invention.

BACKGROUND OF THE INVENTION

1. Field of the Invention

The present invention is generally related to monolithic microwave/millimeter waveguide devices and more particularly to packaging waveguide-to-microstrip transitions for microwave/millimeter waveguide devices.

2. Discussion

In the past, several waveguide-to-microstrip design methodologies have been proposed in an effort to introduce an efficient transition from waveguide to microstrip. The need for such a transition is prompted by the numerous applications it has in present mm-wave (mmW) and microwave/millimeter wave integrated circuit (MMIC) technologies. The increased use of low-cost MMIC components such as low-noise and power amplifiers, in both military and commercial systems continues to drive the search for more affordable and package-integrable transitions.

The current method of signal reception and power transmission within the mmW system is the rectangular waveguide which has a relatively low insertion loss and high power handling capability. In order to keep the overall package cost to a minimum, there is a need for a transition which is mechanically simple and easily integrated into the housing while maintaining an acceptable level of performance.

Current designs have used transitions which were based on stepped ridged waveguides as discussed, for example, in: S. S. Moochalla and C. An, "Ridge Waveguide Used in Microstrip Transition", Microwaves and RF, March 1984; and W. Menzel and A. Klaassen, "On the Transition from Ridged Waveguide to Microstrip", Proc. 19th European Microwave Conf., pp. 1265–1269, 1989. Other designs used antipodal finlines which were discussed, for example, in: L. J. Lavedan, "Design of Waveguide-to-Microstrip Transitions Specially Suited to Millimeter-Wave Applications", Electronic Letters, vol. 13, No. 20, pp. 604–605, September 1997.

Moreover, current designs have used probe coupling which was discussed, for example, in: T. Q. Ho and Y. Shih, "Spectral-Domain Analysis of E-Plane Waveguide to Microstrip Transitions", IEEE Trans. Microwave Theory and Tech., vol. 37, pp. 388–392, February 1989; and D. I. Stones, "Analysis of a Novel Microstrip-to-Waveguide Transition/Combiner", IEEE MTT-S Int'l Symposium Digest, San Diego, Calif., vol. 1, pp. 217–220, 1994.

These current designs suffer from such disadvantages as varying degrees of mechanical complexity. Some of the current transitions are bulky and use several independent pieces that must be assembled in various steps. Additionally, they may require more than one substrate material with multilevel conductors and high-tolerance machining of background housing components such as waveguide steps/tapers, or precise positioning of a backshort. Such precise positioning requirements produce extensive bench tuning after fabrication. Also, current designs require a separate waveguide window and several hermetic sealing process steps to achieve hermetic sealing of the component. These disadvantages render current designs expensive and difficult to integrate into the package.

SUMMARY OF THE INVENTION

A waveguide-to-microstrip transition for processing electromagnetic wave signals includes a waveguide for directing the signals to a waveguide input. A substrate covers the waveguide input and is hermetically sealed to the waveguide. A probe on the substrate overlies the waveguide input.

In another embodiment, the waveguide-to-microstrip transition includes an iris connected to the substrate for substantially matching the impedance between the probe and a microstrip line.

Additional advantages and features of the present invention will become apparent from the subsequent description and the appended claims, taken in conjunction with the accompanying drawings in which:

DETAILED DESCRIPTION OF THE PREFERRED EMBODIMENTS

Figure 1:
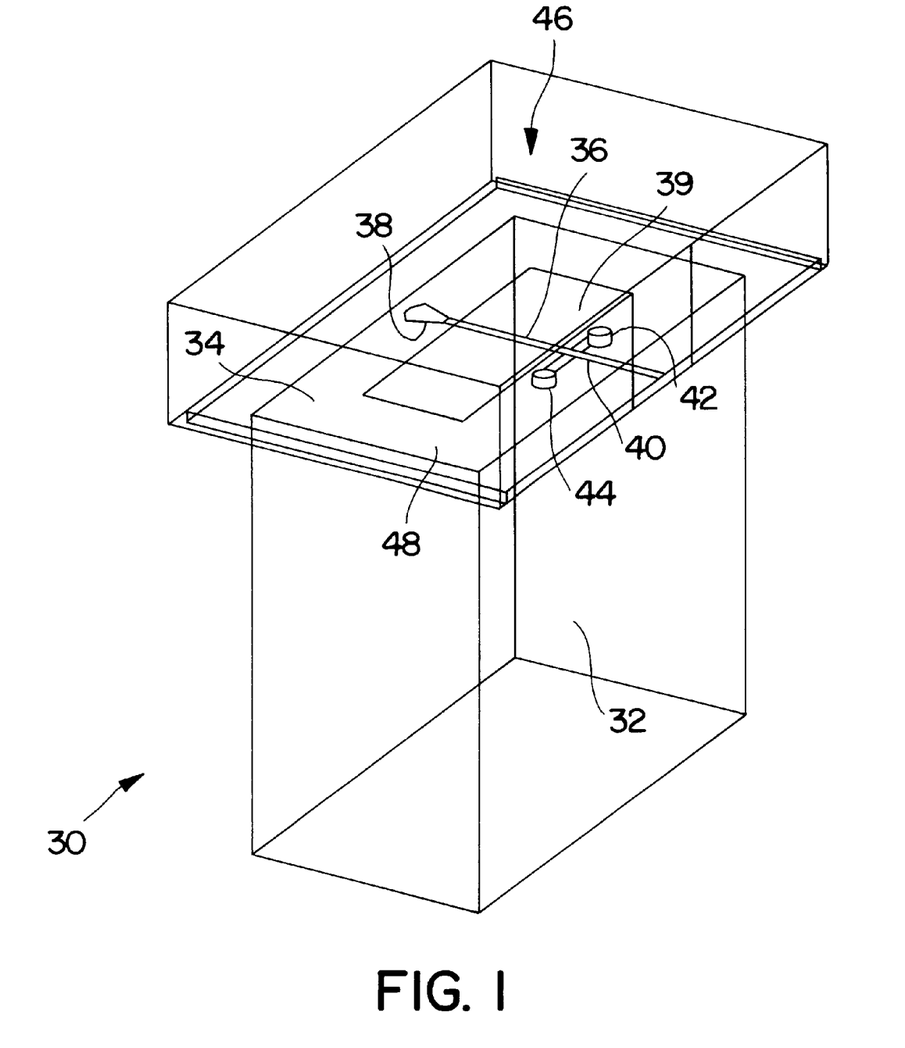
FIG. 1 is a diagrammatic perspective of the waveguide-to-microstrip transition.

Referring to FIG. 1, a waveguide-to-microstrip transition package is generally shown at 30. The opening of waveguide 32 allows electromagnetic millimeter/microwave signals to reach substrate 34. A probe 36 is etched onto the top of substrate 34. Probe 36 terminates with a first stub 38. Transition 39 indicates where probe 36 transitions into a microstrip line 40. Microstrip line 40 has a second stub 42 and a third stub 44; both stubs can be either an open or a shorted element. Above substrate 34 is a cavity 46, and below substrate 34 is an iris 48.

Figure 2:
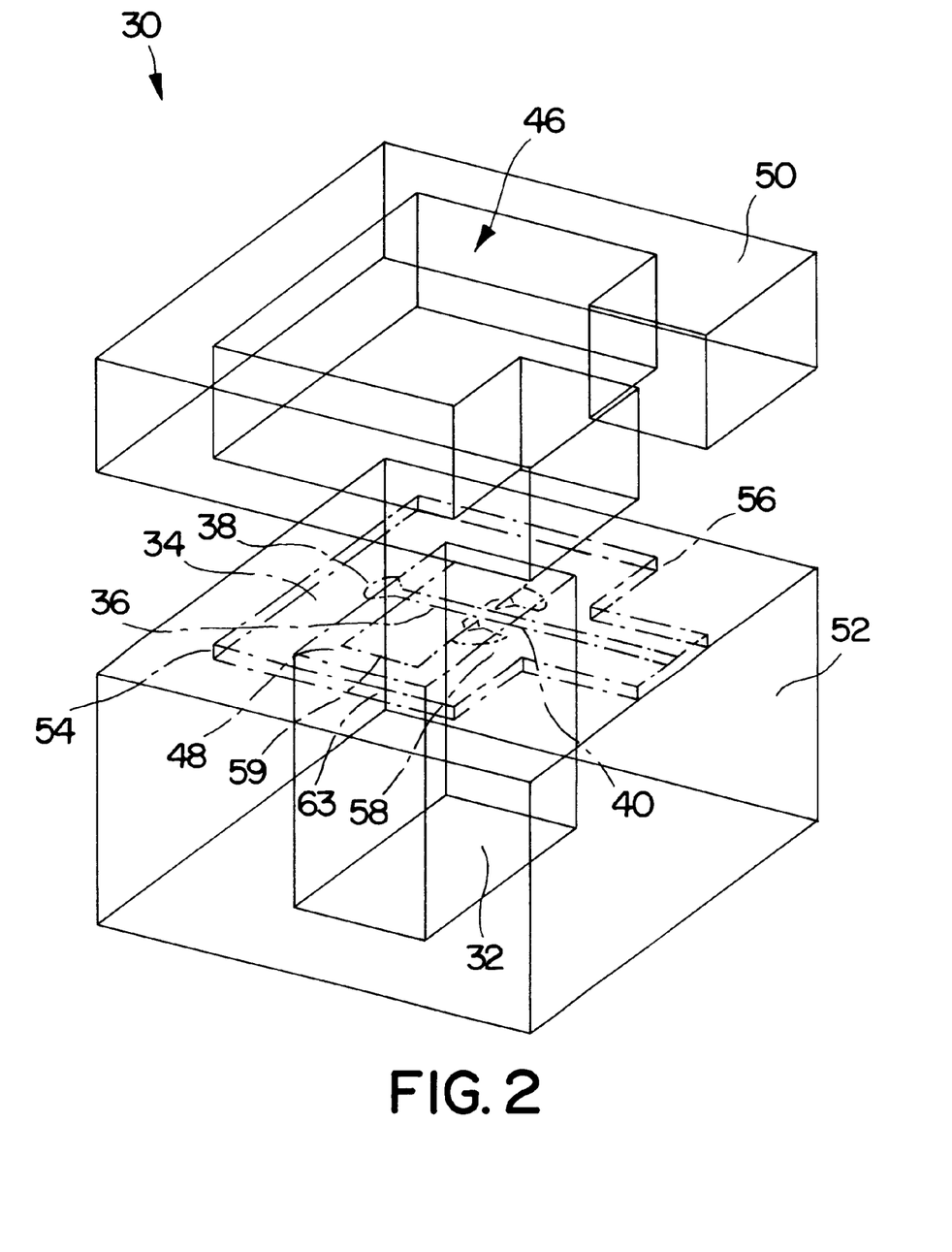
FIG. 2 is a diagrammatic perspective of the waveguide-to-microstrip transition wherein the internal portions of the package are revealed.

FIG. 2 shows the package 30 with its internal structure revealed. A ring frame 50 which is placed on top of base 52 defines cavity 46. Probe 36 which is etched on the backside of substrate 34 eliminates the need for separate assembly steps for the substrate-to-probe adhesion. The etching can be done by a photolithographic or other such process known in the art. Substrate 34 is self-aligning as indicated at location 54 which is advantageous particularly for applications requiring tight tolerances such as W-band packaging applications.

Substrate 34 overlaps waveguide input 63 which makes a natural hermetic seal as indicated at location 56. Iris 48 on waveguide input 63 provides matching between probe 36 and waveguide input 63 as shown at location 58. In addition, iris 48 allows the formation of a cavity 46 above the probe 36, resulting in the backshort length to be a less critical dimension. Location 59 depicts the elimination of glass-to-metal seal contact to substrate.

Figure 3:
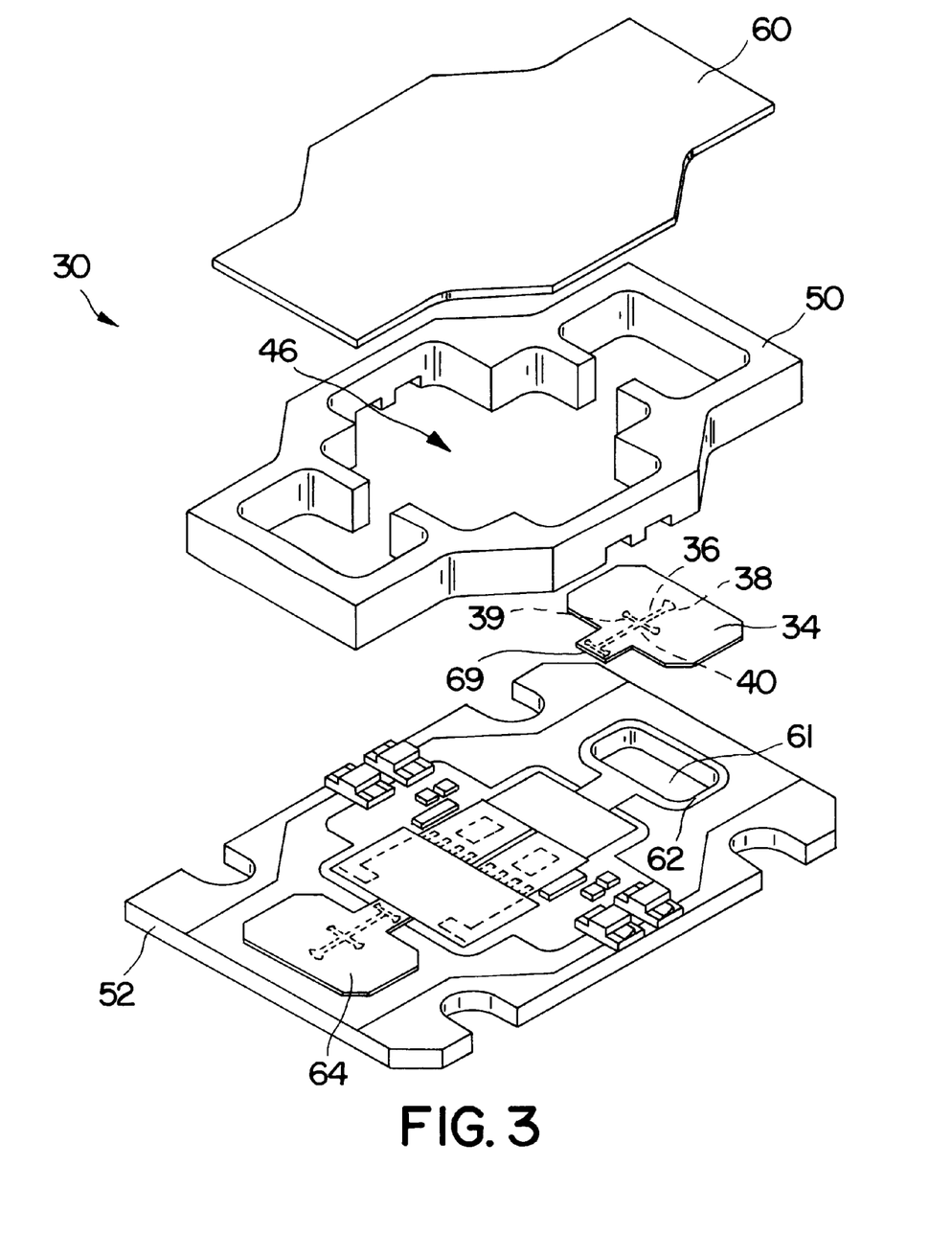
FIG. 3 is an exploded perspective view of the waveguide-to-microstrip transition of the present invention.

Referring to FIG. 3, package 30 is constructed in three parts which has the decided advantage of a lower assembly cost. A cover 60 is placed upon ring frame 50. Cover 60 provides the covering for both the RF components of package 30 as well as for the backshort for transition 39. An opening 61 is provided for the waveguide. Moreover, a trough 62 allows substrate 34 to be accurately aligned with base 52. Substrate 34 is eutectically soldered or epoxied to base 52 for a hermetic seal. A second substrate 64 with the same configuration as substrate 34 is shown.

Optimal coupling of RF power to and from package 30 is accomplished by making use of available iris resonances due to excited higher-order modes and the terminating of the microstrip line 40 in a short circuit at the edge of iris 48 (of FIG. 2) using first stub 38. Thus, the need for high-tolerance backshort positioning is obviated. Impedance matching to the microstrip port 69 is accomplished using microstrip elements designated with reference numerals 40, 42, and 44, rendering a very low-profile design. In this context, a very low-profile design indicates a planar microstrip design versus other designs such as ridged waveguide, or waveguides/coaxial/microstrip transitions.

Ring frame 50 encloses transition 39 with the exception of the opening for the microstrip line 40. Ring frame 50 which provides the perimeter for cavity 46 is assembled along with substrate 34 in one step. Another feature of transition 39 is that cover 60 is an integral part of package 30, and can be laser-welded in place, thus making transition 39 a fully integrated part of package 30 requiring no special assembly steps. These features render transition 39 to be very low-cost and readily integrable into typical microwave and mmW multi-chip assembly (MCA) packages.

In the preferred embodiment: substrate 34 is composed of alumina; with etched gold probe 36 and etched gold iris 48; ring frame 50 is a composition of Alloy 48 and 46; base 52 is of composition of AlSiC (cast) and CuMo (stamped) corresponding respectively. However, it is to be understood that the present invention is not limited to only those compositions referenced above, but includes other materials which produce similar results. For example, substrate 34 may also have the following compositions (but is not limited to): fused silica, duriod, or z-cut quartz.

Figure 4A:
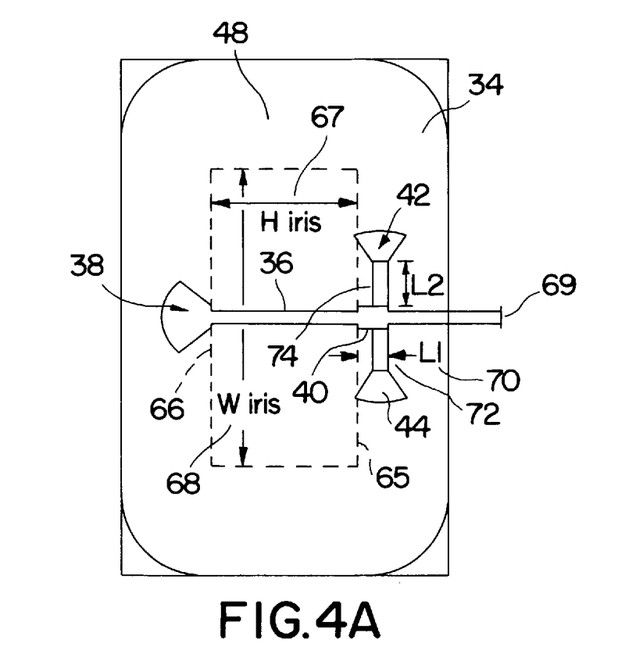
FIG. 4A is a top view of the waveguide-to-microstrip transition showing the network topology.

Referring to FIG. 4A, probe 36 is situated along the E-plane of the waveguide, and is terminated in a short structure (i.e., first stub 38) coincident with edge 66 of iris 48 and connects to the main microstrip line (not shown). This ensures a zero voltage condition at edge 66, and in turn, maximum voltage across the opening of iris 48 and RF coupling to the signal transmitting line. Preferably, first stub 38 is a ninety degree stub. The probe 36, the stubs (38, 40, 42) and iris (48) are patterns formed from etching of gold metallization of both sides of the substrate 34.

The choice of iris height 67 ($H_{iris}$) and iris width 68 ($W_{iris}$) determines the upper bound for the bandwidth of the transition. Iris 48 was modeled as a shunt circuit, where the equivalent circuit parameters model the storage of susceptive energy caused by the non-propagating higher-order modes excited at the discontinuity. These shunt parameters are determined using a variational method such as that described in R. E. Collin, *Field Theory of Guided Waves*, McGraw-Hill, New York, ch. 8, 1960. Because of this total admittance, iris 48 has resonances of its own which can in turn be used to broaden the bandwidth of the transition (see, L. Hyvonen and A. Hujanen, "*A Compact MMIC-Compatible Microstrip to Waveguide Transition*", IEEE MTT-S Int'l Symposium Digest, San Francisco, Calif., vol. 2, pp. 875–878, 1996.

The optimal choice of dimensions of iris 48 is accomplished using a 3D electromagnetic simulator based on Finite Element Method (FEM), such as Ansoft's Maxwell Eminence or Hewlett-Packard's HFSS.

Matching of the impedance presented by iris 48 to the microstrip port 69 is accomplished by using two symmetrical shunt lines 72 and 74 which are short-circuited using second and third stubs (42 and 44). Shunt lines 72 and 74 are a predetermined distance 70 ($L_1$) away from edge 65. This distance is chosen so that at point "a":

$$Y_a = Y_0 + jB_a \qquad (EQ1)$$

where $Y_0$ is the characteristic admittance of the microstrip line 40. The lengths of shunt lines 72 and 74 ($L_2$) are chosen such that they each present:

$$-j\frac{B_a}{2}[\text{mhos}] \qquad (EQ2)$$

to microstrip line 40 at $f_0$, where $B_a$ is the susceptance from (EQ 1). The use of two symmetrical shunt lines 72 and 74 in parallel assist in keeping the response broadband due to the higher series reactance seen by microstrip line 40:

$$X_a = \frac{2}{B_a}[\text{ohms}]. \qquad (EQ3)$$

In alternate embodiments, fine tuning of the response with respect to $f_0$ is implemented by varying $W_{iris}$ 68 accordingly.

Figure 5:
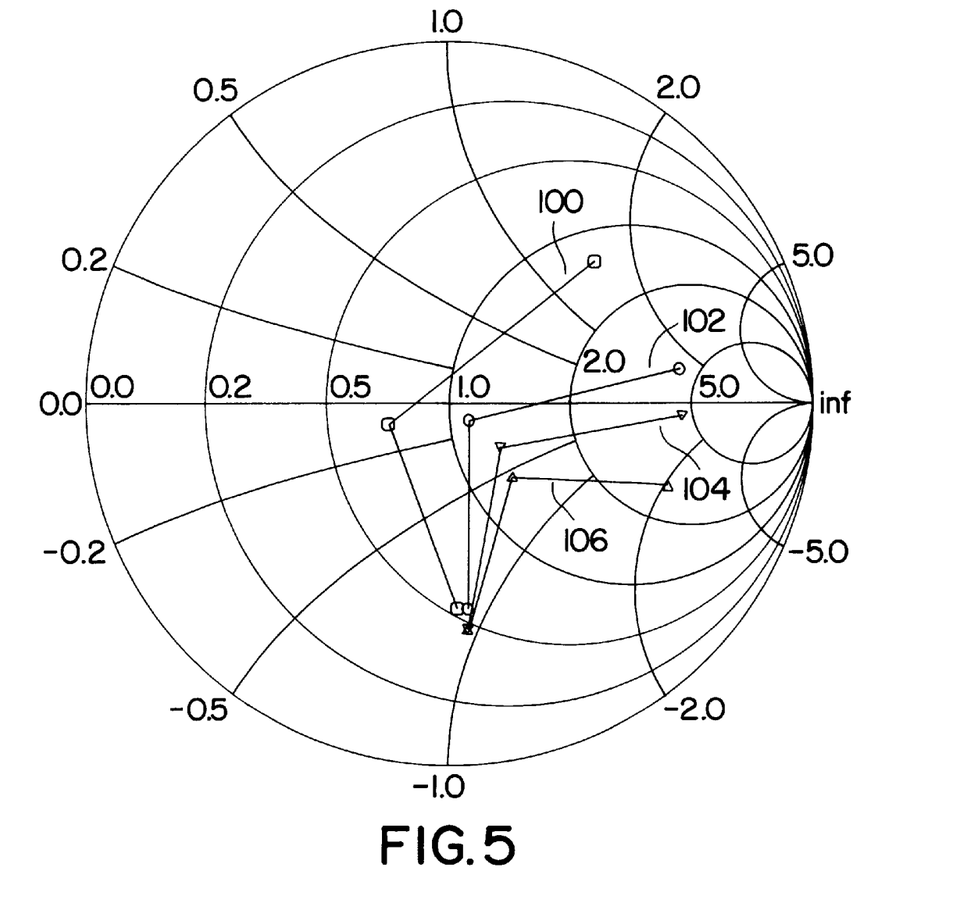
FIG. 5 is a Smith chart used to determine the W-band dimensions for the iris.

Referring to FIG. 5, the input impedance referenced to the near edge of the iris is plotted on a Smith Chart parametrically as a family of curves for each $H_{iris}$ as a function of $W_{iris}$, $Z_{in}(W_{iris})|_{Hiris}$. For the W-band design, choosing a curve with the least variation in $Z_{in}(W_{iris})_{Hiris}$ is equivalent to choosing the iris dimensions that will afford the broadest bandwidth for the matched transition.

Curve 100 depicts the following three points which pair $H_{iris}$ with $W_{iris}$: (20.0 mils, 70 mils); (20.0 mils, 80 mils); and (20.0 mils, 90 mils). Curve 102 depicts the following three points which pair $H_{iris}$ with $W_{iris}$: (25.0 mils, 70 mils); (25.0 mils, 80 mils); and (25.0 mils, 90 mils). Curve 104 depicts the following three points which pair $H_{iris}$ with $W_{iris}$: (27.5 mils, 70 mils); (27.5 mils, 80 mils); and (27.5 mils, 90 mils). Curve 106 depicts the following three points which pair $H_{iris}$ with $W_{iris}$: (30.0 mils, 70 mils); (30.0 mils, 80 mils); and (30.0 mils, 90 mils). Curve 106 exhibits at $H_{iris}$ equal to 30.0 mils the least variation as a function of $W_{iris}$. When the iris is implemented with an $H_{iris}$ of 30.0 mils and an $W_{iris}$ of 80 mils, the present invention provides for broadband performance.

Figure 4B:
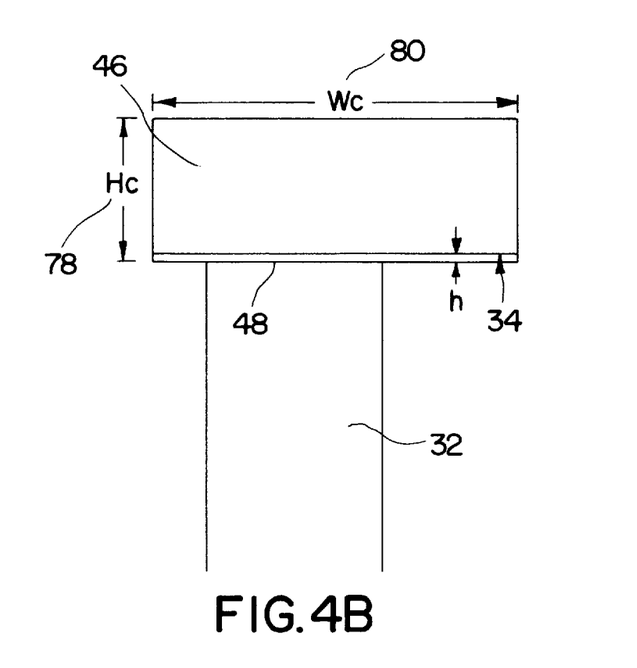
FIG. 4B is a side view of the waveguide-to-microstrip transition depicting the waveguide and cavity dimensions.

Referring to FIG. 4B, the dimensions of cavity 46 (i.e., cavity height 78 and cavity width 80) are selected such that its modal resonances are not too close to the operating frequency. Usually, resonances are chosen such that:

$$\left|\frac{f_0 - f_{res_i}}{f_0}\right| \geq 0.1; i = 1, 2 \qquad (EQ4)$$

where $f_0$ is the center operating frequency, and the $f_{res_i}$ are the two closest resonances bounding the center frequency. Because of the relative isolation of cavity 46 from waveguide 32 due to iris 48, the present invention has the distinct advantage that the exact height of the backshort (i.e. $H_C$ 78) is not crucial to the electrical performance of the transition.

A Q-band design on 5 mil alumina ($\epsilon_r$=9.9), and a W-band design on 5 mil z-cut quartz ($\epsilon_r$=4.7) are discussed below. Models of these two designs were simulated using 3D FEM simulators, employing a relatively strict convergence criteria. S-parameter measurements of the transitions were facilitated by employing two identical transitions fixed in a back-to-back arrangement (as shown for example in FIG. 3, where the two transitions would be connected through a 50 ohm microstrip line, rather than the active MMIC devices shown). The transitions are connected using a 50 Ohm microstrip line, 955 mils long for the Q-band fixture and 830 mils long for the W-band fixture, to allow the distinct characterization of the transitions without any interactive effects.

Figure 6:
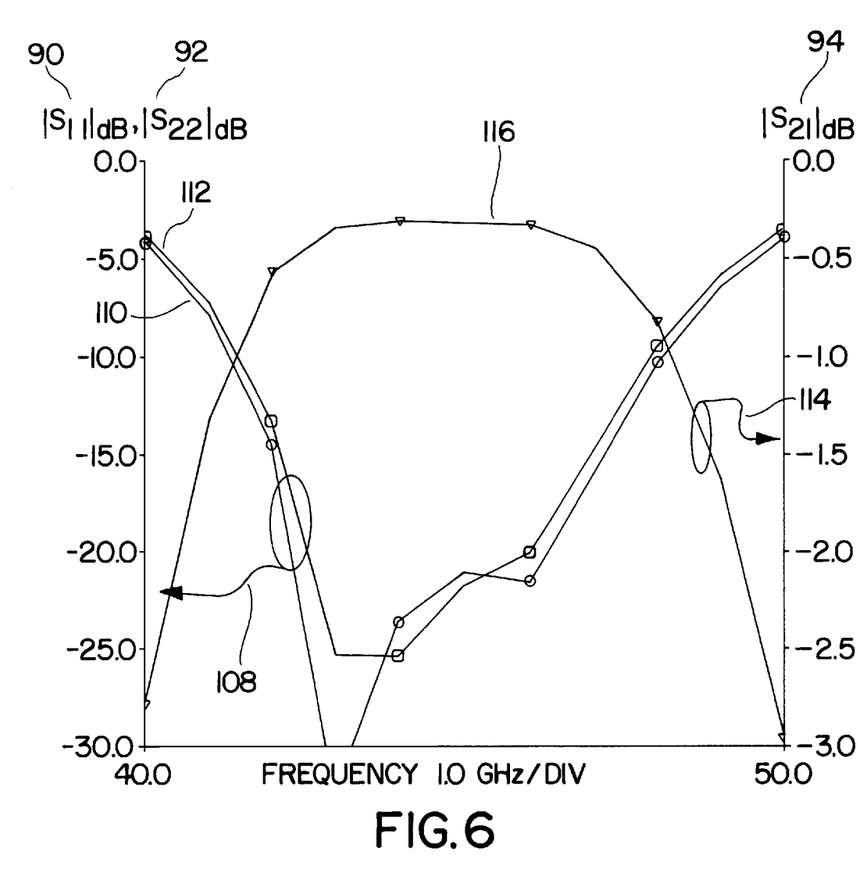
FIG. 6 is an X-Y graph illustrating the predicted results of the Q-band transition.

FIG. 6 shows the theoretical values of:
$|S_{11}|_{dB}$ (Reference 90), $|S_{22}|_{dB}$ (Reference 92) and $|S_{21}|_{dB}$ (Reference 94)
for the Q-band transition. Indicator 108 indicates that curves 110 and 112 use the leftmost ordinate values. Reference 90 which is curve 110 represents the reflection coefficient from the waveguide; reference 92 which is curve 112 represents the reflection coefficient from the microstrip line; and reference 94 which is curve 116 represents the transmission characteristics. Indicator 114 indicates that curve 116 uses the rightmost ordinate values. Theoretical dielectric and planar conductor losses are accounted for in the model simulation. The frequency rate is approximately in the 44 GHz region. For a 15 dB return loss, a bandwidth greater than 10% is predicted. The insertion loss of the transition throughout the band of interest is ~0.35 dB.

Figure 7:
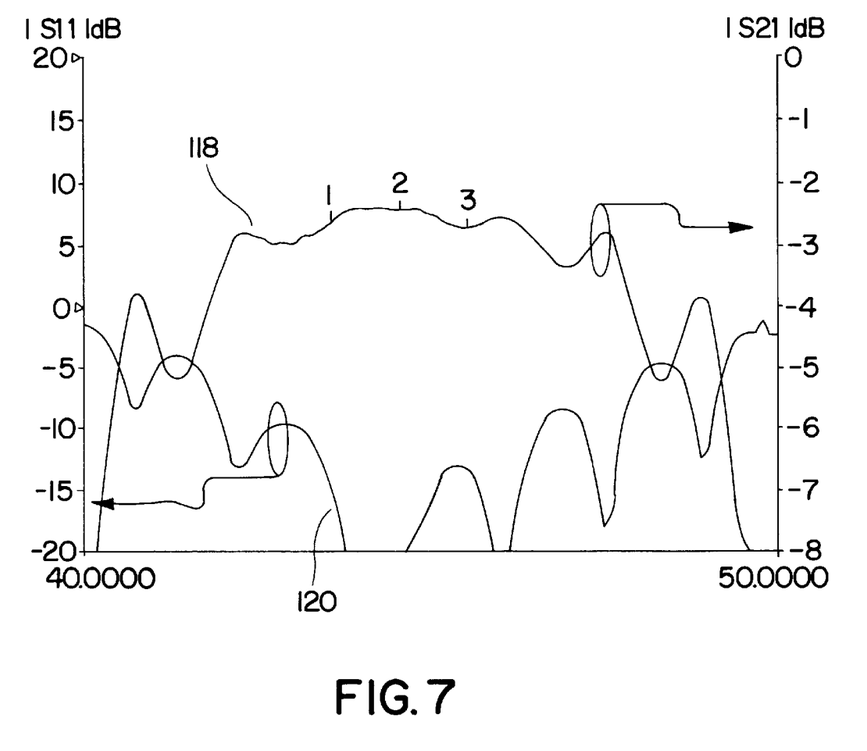
FIG. 7 is an X-Y graph showing the measured data of two back-to-back Q-band transitions.

FIG. 7 shows the Q-band measured data of two back-to-back transitions obtained on an automated network analyzer (ANA). The measured results corresponding to one transition can be determined from the back-to-back transitions data. Curve 118 represents the insertion loss. Curve 120 represents reflection coefficient. By accounting for the microstrip line and test fixture losses based on separate measurements (1.8 dB/in and 0.2 dB, respectively, at 44 GHz), the return and insertion losses of one transition can be calculated. A 10% bandwidth is deduced for a 15 dB return loss, and the insertion loss per transition is found to be less than 0.3 dB. Around the center of the band, a return loss better than 22 dB has been obtained.

Figure 8:
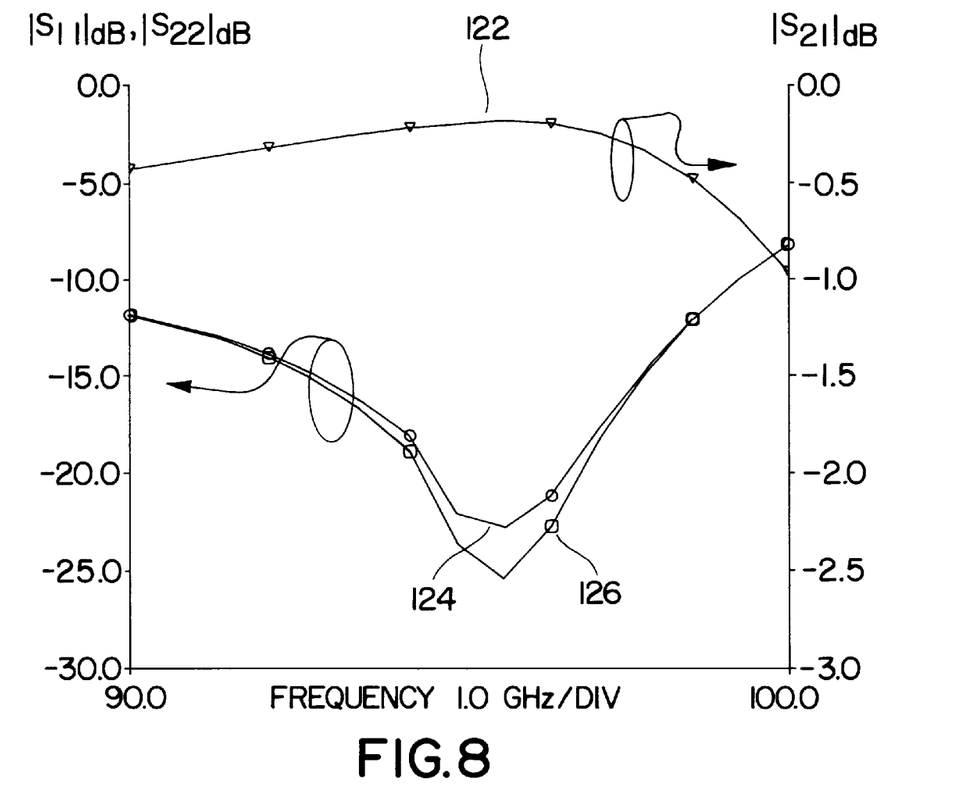
FIG. 8 is an X-Y graph showing the predicted results of the W-band transition.

FIG. 8 shows the theoretical values for the W-band transition including loss. Curve 122 represents the insertion loss response. Curve 124 represents the output reflection coefficient. Curve 126 represents the input reflection coefficient. The frequency range is approximately in the 94 GHz region. For a 15 dB return loss bandwidth, an insertion loss better than 0.35 dB can be achieved. The W-band design was implemented on a lower permittivity substrate (z-cut quartz) for bandwidth considerations. The higher overall circuit Q in this frequency band leads to a narrower response than that at Q-band.

Figure 9:
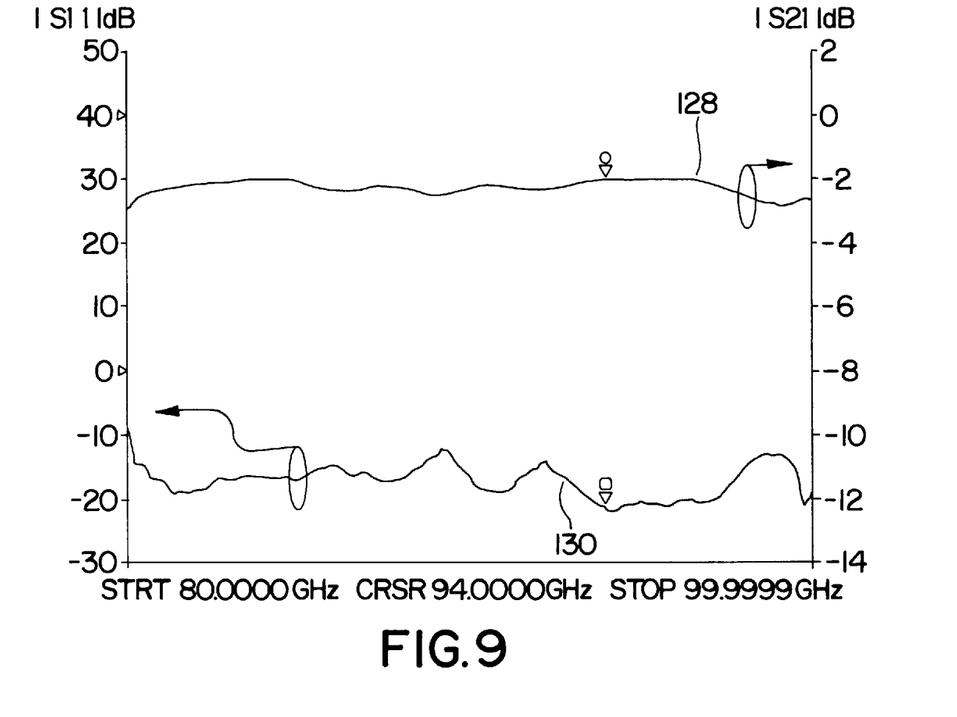
FIG. 9 is an X-Y graph showing the measured data of two back-to-back W-band transitions.

FIG. 9 shows the W-band back-to-back transitions measured data. Curve 128 represents insertion loss. Curve 130 represents input reflection coefficient. From these, the frequency response of the transitions exhibits a relatively wider and flatter bandwidth than that shown in FIG. 8. A 12% bandwidth with a 15 dB return loss can be deduced. The insertion loss is found to be less than 0.2 dB per transition, using a value of 1.61 dB/in for the microstrip line and test fixture losses at 94 GHz.

The embodiments which have been set forth above were for the purpose of illustration and were not intended to limit the invention. It will be appreciated by those skilled in the art that various changes and modifications may be made to the embodiments discussed in the specification without departing from the spirit and scope of the invention as defined by the appended claims.

It is claimed:

1. A waveguide-to-microstrip transition for processing electromagnetic wave signals comprising:
    a waveguide for directing said signals to a waveguide input;
    a cover for forming at least a portion of a cavity over said waveguide input, said cover providing both a backshort and a seal for said transition;
    a first substrate for completely covering said waveguide input so as to form a hermetic seal over said waveguide input, said first substrate being substantially disposed in said cavity;
    a first probe on said first substrate for conducting said signals to a microstrip line, and overlying said waveguide input; and
    a second substrate having a second probe and completely covering another waveguide input so as to form a hermetic seal over said another waveguide input;
    said first and second substrates constituting separate substrates; and
    a first stub disposed on at least said first substrate; a second stub disposed on at least said first substrate; whereby said first and second stubs have been short-circuited for substantially matching the impedance between said first probe and said microstrip line.

2. The transition according to claim 1 wherein said transition is incorporated into a package containing one or more components selected from the group consisting of radio frequency components, microwave frequency components, and millimeter frequency components, said first and second probes being connected to said components for providing said signals to said components.

3. The transition according to claim 2 wherein said components include at least one integrated circuit chip for processing said signals from said first and second probes.

4. The transition according to claim 2 further comprising:
    a frame connected to said first substrate, said frame defining at least a portion of said cavity which contains said first probe, said frame defining at least a portion of a cavity which contains said second probe; and
    said cover being fastened onto said frame.

5. The transition according to claim 1 further comprising:
    a base connected to said waveguide input and having a trough surrounding said waveguide input, said first substrate being insertable into said trough thereby forming said hermetic seal, said trough providing alignment of said first substrate with said base, said second substrate being separately insertable into said trough thereby forming said hermetic seal, said trough providing alignment of said second substrate with said base.

6. The transition according to claim 5 wherein said first and second substrates are eutectically soldered substrates with respect to said base for forming a hermetic seal with said base.

7. The transition according to claim 1 further comprising:
a base, said first and seconds substrates are eutectically soldered substrates with respect to said base thereby forming said hermetic seal.

8. The transition according to claim 1 wherein said first and second probes are etched probes respectively upon said first and second substrates.

9. A waveguide-to-microstrip transition for processing electromagnetic wave signals comprising:
a waveguide for directing said signals to a waveguide input;
a cover for forming at least a portion of a cavity over said waveguide input, said cover providing both a backshort and a seal for said transition;
a substrate connected to said waveguide input;
a probe disposed upon said substrate for conducting said signals to a microstrip line; and
an iris being substantially disposed in said cavity for providing isolation for said cavity, a first stub disposed on said substrate; a second stub disposed on said substrate; whereby said first and second stubs have been short circuited for substantially matching the impedance between said probe and said microstrip line.

10. The transition according to claim 9 further comprising:
third stub disposed on said substrate;
whereby said first and second and third stubs have been short-circuited for substantially matching the impedance between said probe and said microstrip line.

11. The transition according to claim 10 wherein said first stub is connected to said probe, said second and third stubs are connected to said microstrip line.

12. The transition according to claim 10 wherein said substrate has a first side and a second side, said probe being etched onto the first side of said substrate, said iris being appended onto the second side of said substrate.

13. The transition according to claim 10 wherein the dimensions of said iris are determined so as to allow said transition to operate in a broadband capacity.

14. The transition according to claim 10 wherein said substrate overlaps said waveguide input thereby forming a hermetic seal, and wherein said probe is etched upon said substrate.

15. The transition according to claim 10 wherein said transition is incorporated into a package containing one or more components selected from the group consisting of radio frequency components, microwave frequency components, or millimeter frequency components.

16. The transition according to claim 15 wherein said components include at least one integrated circuit chip for processing said conducted signals from said microstrip line.

17. The transition according to claim 15 further comprising:
a frame connected to said substrate, said frame defining a cavity which contains said probe;
a cover which is fastened onto said frame; and
a base having a trough which surrounds said waveguide input, said substrate being insertable into said trough thereby forming a hermetic seal between said base and said substrate, said substrate being eutectically soldered to said base to form a hermetic seal with said base.

18. A waveguide-to-microstrip transition for processing electromagnetic wave signals comprising:
a waveguide for directing said signals to a waveguide input;
a cover for forming at least a portion of a cavity over said waveguide input, said cover providing both a backshort and a seal for said transition;
a substrate covering said waveguide input, said substrate being hermetically sealed to said waveguide;
a probe on said substrate and overlying said waveguide input;
an iris for providing isolation for said cavity, said iris being substantially disposed in said cavity;
a microstrip line which is connected to said probe;
a first stub disposed on said substrate; and
a second and third stub disposed on said substrate;
said first and second and third stubs having been short-circuited for substantially matching the impedance between said probe and said microstrip line;
said first stub being connected to said probe, said second and third stubs are connected to said microstrip line.

* * * * *